United States Patent
Mori et al.

(10) Patent No.: US 10,538,059 B2
(45) Date of Patent: Jan. 21, 2020

(54) SPUTTERING TARGET FOR FORMING PROTECTIVE FILM, AND LAMINATED WIRING FILM

(71) Applicant: MITSUBISHI MATERIALS CORPORATION, Tokyo (JP)

(72) Inventors: Satoru Mori, Okegawa (JP); Sohei Nonaka, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 403 days.

(21) Appl. No.: 14/247,591

(22) Filed: Apr. 8, 2014

(65) Prior Publication Data
US 2014/0315043 A1   Oct. 23, 2014

(30) Foreign Application Priority Data
Apr. 22, 2013   (JP) .................. 2013-089721

(51) Int. Cl.
*H05K 1/09*   (2006.01)
*B32B 15/01*   (2006.01)
*H01J 37/34*   (2006.01)

(52) U.S. Cl.
CPC .......... *B32B 15/01* (2013.01); *H01J 37/3429* (2013.01); *H01J 37/342* (2013.01); *Y10T 428/12778* (2015.01)

(58) Field of Classification Search
CPC ............................ H01J 37/3429; H01J 37/342
See application file for complete search history.

(56) References Cited

U.S. PATENT DOCUMENTS 4,110,132 A * 8/1978 Parikh ...................... C22F 1/08
                                                     148/432
4,632,806 A * 12/1986 Morikawa ............... B32B 15/01
                                                     420/471
5,874,043 A * 2/1999 Sarkhel ................. B23K 35/262
                                                     420/557

(Continued)

FOREIGN PATENT DOCUMENTS

JP      H111735 A      1/1999
JP      2006241587 A   9/2006

(Continued)

OTHER PUBLICATIONS

English language translation of JP11-001735A; Generated on Oct. 3, 2017 with AIPN Japanese Patent Office Website (https://dossier1.j-platpat.inpit.go.jp/tri/all/odse/ODSE_GM101_Top.action).*

(Continued)

*Primary Examiner* — Mark Ruthkosky
*Assistant Examiner* — Julia L Rummel
(74) *Attorney, Agent, or Firm* — Locke Lord LLP

(57) ABSTRACT

A sputtering target for forming protective film which is used to form a protective film on one surface or both surfaces of a Cu wiring film contains Ni: 5.0 to 15.0% by mass, Mn: 2.0 to 10.0% by mass, Zn: 30.0 to 50.0% by mass, Al: 0.5 to 7.0% by mass, and a remainder composed of Cu and inevitable impurities. A laminated wiring film is provided with a Cu wiring film and the protective film formed on one surface or both surfaces of the Cu wiring film, and the protective film is formed by the above-described sputtering target for forming protective film.

2 Claims, 4 Drawing Sheets

(56) References Cited

U.S. PATENT DOCUMENTS

| | | | |
|---|---|---|---|
| 6,123,738 A | 9/2000 | Childers et al. | |
| 6,123,783 A * | 9/2000 | Bartholomeusz | H01F 41/183 |
| | | | 148/312 |
| 2004/0118679 A1 * | 6/2004 | Taniguchi | B23K 1/0008 |
| | | | 204/298.12 |
| 2006/0233692 A1 * | 10/2006 | Scaringe | B82Y 30/00 |
| | | | 423/335 |

FOREIGN PATENT DOCUMENTS

| | | |
|---|---|---|
| JP | 2011052304 A | 3/2011 |
| JP | 2012-193444 A | 10/2012 |

OTHER PUBLICATIONS

Chen, Z.; Dinh, H.; Miller, E.; "Photoelectrochemical Water Splitting Standards, Experimental Methods, and Protocols", 2013, Springer New York, p. 22.*

Konecna, R.; Fintova, S.; "Copper and Copper Alloys: Casting, Classification and Characteristic Microstructures", 2012, p. 3-30.*

Office Action, of the Japanese Patent Office, dated Dec. 13, 2016, in corresponding Japanese Patent Application No. 2013-089721.

Search Report, of The State Intellectual Property Office of P.R. China, dated Feb. 23, 2017, in corresponding Chinese Patent Application No. 2014101515823.

* cited by examiner

SPUTTERING TARGET FOR FORMING PROTECTIVE FILM, AND LAMINATED WIRING FILM

TECHNICAL FIELD

The present invention is related to a sputtering target for forming a protective film which is used to form a protective film protecting a copper (Cu) wiring film containing copper or copper alloy, and a laminated wiring film provided with the protective film formed by the sputtering target.

Priority is claimed on Japanese Patent Application No. 2013-089721, filed Apr. 22, 2013, the contents of which are incorporated herein by reference.

BACKGROUND ART

Conventionally, Aluminum (Al) is broadly used as a wiring film of a flat panel display such as a liquid crystal display or an organic EL display and as a wiring film of a touch panel or the like. Recently, miniaturization (narrowing of width) and thinning of a wiring film has been developed, and a wiring film having a lower specific resistance than a conventional one is in demand.

According to the above miniaturization and thinning of a wiring film, a wiring film using copper or copper alloy, which is a material having a lower specific resistance than Al, has been provided.

However, there has been a problem such that the Cu wiring film formed by copper or copper alloy and having a low specific resistance is easily discolored in an atmosphere having humidity. In a case of using a copper alloy containing a large amount of additive elements in order to improve the weather resistance, it leads to an increase of the specific resistance.

Thus, for example, in Patent Document 1, a laminated film in which a protective film formed by Ni—Cu—(Cr, Ti) alloy is formed on the Cu wiring film, and a sputtering target used to form the protective film have been proposed. Since this protective film has a higher weather resistance than that of copper, the protective film can suppress the discoloration of the surface of the Cu wiring film even if the laminated film is stored in the atmosphere.

PRIOR ART DOCUMENTS

Patent Documents

[Patent Document 1] Japanese Unexamined Patent Application, First Publication No. 2012-193444

DISCLOSURE OF THE INVENTION

Problems to be Solved by the Invention

When a patterning is performed by etching the Cu wiring film formed by copper or copper alloy, an etching solution containing iron chloride is used. When the above-described laminated film having the protective film formed by Ni—Cu—(Cr, Ti) alloy is etched with an etching solution containing iron chloride, a residue, which is part of the protective film being undissolved, has a possibility to be left. Since this residue can cause short-circuit between wirings, the laminated film was difficult to utilize as a wiring film.

Moreover, when the fine burrs occurs in the etched wiring end face, defects called voids are generated at the edge of the Cu wiring film as resulting from the burrs, and breakage of wiring is induced during repeating of lamination, and the decrease in the quality and yield can occur.

In addition, when Chromium (Cr) is contained in the protective film, Cr will be contained in the waste liquid after etching, and there is a problem that a treatment of the waste liquid costs money.

Furthermore, since a large amount such as 35 to 84.5% by mass of Ni which is relatively expensive is contained in the protective film, there is a problem of the increase in manufacturing cost of the sputtering target and the laminated wiring film.

The present invention has been made in view of the above circumstances, and the object thereof is: to provide a sputtering target for forming a protective film which can form a protective film having good weather resistance and being able to suppress the surface discoloration, having good etching properties, and being able to suppress the occurrence of burrs and generation of the undissolved residue; and to provide a laminated wiring film provided with the protective film formed by the sputtering target.

Means for Solving the Problem

In order to solve the above problems, (1) a sputtering target for forming protective film according to one aspect of the present invention is used to form a protective film on one surface or both surfaces of a Cu wiring film, and the sputtering target contains Ni: 5.0 to 15.0% by mass, Mn: 2.0 to 10.0% by mass, Zn: 30.0 to 50.0% by mass, Al: 0.5 to 7.0% by mass, and the remainder composed of Cu and inevitable impurities.

In the sputtering target for forming a protective film of the present invention with this configuration, since the sputtering target is formed by a Cu-base alloy containing a composition of Ni: 5.0 to 15.0% by mass, Mn: 2.0 to 10.0% by mass, Zn: 30.0 to 50.0% by mass, Al: 0.5 to 7.0% by mass, and the remainder composed of Cu and inevitable impurities, even if etching is performed by an etching solution including iron chloride, etching is performed in the same extent with a Cu wiring film, and the generation of the undissolved residue can be suppressed.

In addition, since 0.5 to 7.0% by mass of Al is contained in the sputtering target, the fine burrs occurring on an end face of the etched laminated wiring film can be suppressed and generation of voids can be suppressed.

Furthermore, since the content of Ni is a relatively small amount such as 5.0 to 15.0% by mass, the manufacturing cost of the sputtering target and the protective film can be reduced significantly.

(2) The sputtering target for forming protective film according to another aspect of the present invention is the sputtering target described in (1), and the sputtering target contains Ni: 7.0 to 11.0% by mass, Mn: 4.0 to 8.0% by mass, Zn: 35.0 to 45.0% by mass, Al: 2.0 to 5.0% by mass, and the remainder composed of Cu and inevitable impurities.

In the sputtering target for forming a protective film of the present invention with this configuration, since the sputtering target is formed by a Cu-base alloy containing a composition described above, even if etching is performed by an etching solution including iron chloride, etching is performed in a same extent with a Cu wiring film, and the generation of the undissolved residue can be suppressed more.

In addition, since 2.0 to 5.0% by mass of Al is contained in the sputtering target, the fine burrs occurring on the end face of the etched laminated wiring film can be suppressed more and generation of voids can be suppressed more.

Furthermore, since the content of Ni is a relatively small amount such as 7.0 to 11.0% by mass, the manufacturing cost of the sputtering target and the laminated wiring film can be reduced more significantly.

(3) A laminated wiring film according to another aspect of the present invention is provided with a Cu wiring film and a protective film formed on one or both surfaces of the Cu wiring film, and the protective film is formed by the sputtering target described in (1) or (2).

In the laminated wiring film of the present invention with this configuration, since the protective film is formed by the sputtering target containing a composition described above, the weather resistance improves, and even if the laminated wiring film is stored in the atmosphere, the discoloration can be suppressed.

In addition, since the protective film is configured by the Cu-based alloy, even if etching is performed by an etching solution including iron chloride, the generation of the undissolved residue can be suppressed. Furthermore, since Al is contained in the protective film, the fine burrs occurring on the end face of the etched laminated wiring film can be suppressed and generation of voids can be suppressed.

In addition, since Cr is not contained in the protective film, treatment of the waste liquid after etching can be performed in a low cost. Furthermore, since the content of Ni is a relatively small amount, the manufacturing cost of the laminated wiring film can be reduced significantly.

(4) The laminated wiring film according to another aspect of the present invention is the laminated wiring film described in (3), the Cu wiring film is formed by copper and copper alloy, and the specific resistance of the Cu wiring film is 4.0 $\mu\Omega cm$ or less at a temperature of 25° C.

(5) The laminated wiring film according to another aspect of the present invention is the laminated wiring film described in (4), the Cu wiring film is formed by an oxygen-free copper having a purity of 99.99% by mass or more, and the specific resistance of the Cu wiring film is 3.5 $\mu\Omega cm$ or less at a temperature of 25° C.

(6) The laminated wiring film according to another aspect of the present invention is the laminated wiring film described in (3), and a thickness A of the Cu wiring film is 50 nm≤A≤800 nm.

Since the Cu wiring film is formed by copper and copper alloy having 4.0 $\mu\Omega cm$ or less of the specific resistance (at 25° C. of temperature) and the thickness A of the Cu wiring film is within 50 nm≤A≤800 nm, a good conduction can be obtained by the Cu wiring film.

(7) The laminated wiring film according to the another aspect of the present invention is the laminated wiring film described in (3), and a thickness B of the protective film is 5 nm≤B≤100 nm.

(8) The laminated wiring film according to another aspect of the present invention is the laminated wiring film described in (3), and the ratio B/A, which is a ratio between the thickness A of the Cu wiring film and the thickness B of the protective film, is 0.02<B/A<1.0.

Since the thickness B is 5 nm≤B≤100 nm and the ratio B/A, which is a ratio between the thickness A of the Cu wiring film and the thickness B of the protective film, is within 0.02<B/A<1.0, the discoloration of the Cu wiring film can be reliably suppressed.

Effects of the Invention

As described above, the present invention can provide: a sputtering target for forming a protective film which can form a protective film having good weather resistance and being able to suppress the surface discoloration, having good etching properties, and being able to suppress the occurrence of burrs and generation of the undissolved residue; and a laminated wiring film provided with the protective film formed by the sputtering target.

EMBODIMENTS OF THE INVENTION

Figure 1:
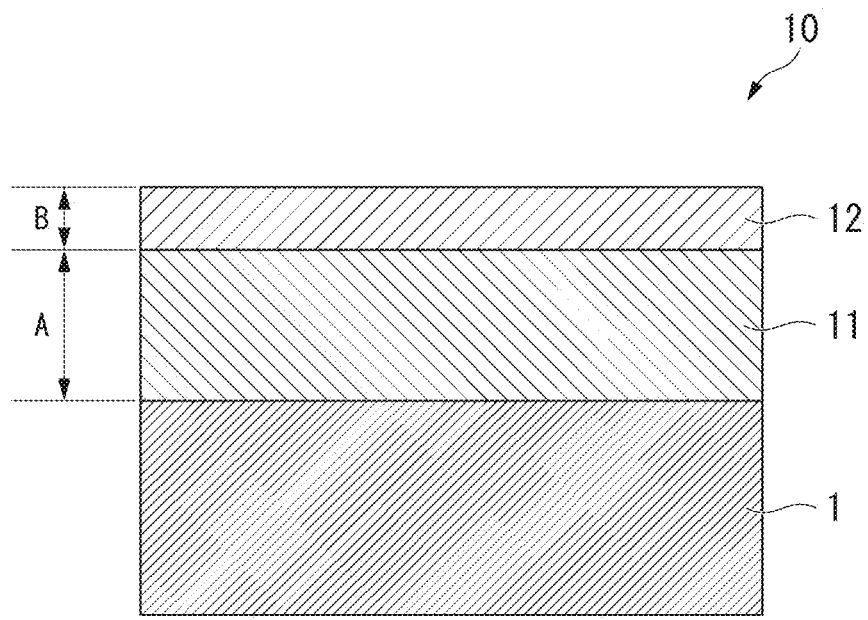
FIG. 1 is an explanatory view of a cross-section of a laminated wiring film which is an embodiment of the present invention.

In a description below, a sputtering target for forming a protective film and a laminated wiring film which are an embodiment of the present invention are explained.

A sputtering target for forming a protective film of the present embodiment is used to form a protective film on a Cu wiring film formed by copper or copper alloy.

The sputtering target for forming protective film has composition of Ni: 5.0 to 15.0% by mass, Mn: 2.0 to 10.0% by mass, Zn: 30.0 to 50.0% by mass, Al: 0.5 to 7.0% by mass, and the remainder composed of Cu and inevitable impurities.

In addition, the sputtering target for forming a protective film is fabricated through a casting process, hot rolling, cold rolling, heat treatment, and machining.

The description below explains the reason why the composition of the sputtering target for forming a protective film of the present embodiment is defined as described above.

(Ni: 5.0 to 15.0% by Mass)

Nickel (Ni) is an element which improves the weather resistance of Cu. The discoloration can be suppressed by containing Ni.

Here, when the content of Ni is less than 5.0% by mass, the weather resistance does not improve sufficiently and the content thereof cannot sufficiently suppress the discoloration of the Cu wiring film 11. On the other hand, when the content of Ni exceeds 15.0% by mass, etching properties are deteriorated and an undissolved residue can be generated when etching by an etching solution containing iron chloride. In addition, it reduces hot workability and machinability.

For these reasons, the content of Ni is in the range of 5.0 to 15.0% by mass. More preferably, the content of Ni is in the range of 7.0 to 11.0% by mass.

(Mn: 2.0 to 10.0% by Mass)

Manganese (Mn) is an element which improves the weather resistance of Cu similarly to Ni. In addition, it has an operation and effects of improving fluidity of a molten metal, hot workability and machinability. Furthermore, since Mn is not an expensive element compared with Ni, the cost can be reduced by adding Mn as a replacement for Ni.

Here, when the content of Mn is less than 2.0% by mass, the weather resistance does not improve sufficiently and the content thereof cannot sufficiently suppress the discoloration. On the other hand, when the content of Mn exceeds 10.0% by mass, etching properties are deteriorated and an undissolved residue can be generated when etching by an etching solution containing iron chloride. Moreover, further improvement of the effect as described above is not observed, and there is a deterioration of hot workability and cold workability rather than an improvement.

For these reasons, the content of Mn is in the range of 2.0 to 10.0% by mass. More preferably, the content of Ni is in the range of 4.0 to 8.0% by mass.

(Zn: 30.0 to 50.0% by Mass)

Zinc (Zn) is an element which improves workability along with mechanical properties. The fabrication of the sputtering target for forming a protective film can be performed satisfactory by containing Zn.

Here, when the content of Zn is less than 30.0% by mass, hot workability does not improve sufficiently and cracks can occur during hot rolling. On the other hand, when the content of Zn exceeds 50.0% by mass, cold workability is deteriorated and cracks can occur during cold rolling.

For these reasons, the content of Zn is in the range of 30.0 to 50.0% by mass. More preferably, the content of Zn is in the range of 35.0 to 45.0% by mass.

(Al: 0.5 to 7.0% by Mass)

In a laminated wiring film formed by a protective film, which is formed by Cu—Ni—Mn—Zn alloy, and a Cu wiring film, Aluminum (Al) is an element which suppresses the generation of burrs on the end face of the etched laminated wiring film. That is, by adding Al into Cu—Ni—Mn—Zn alloy, the fine burrs on the end face of the etched laminated wiring film is removed and the end face thereof can be made smooth, and the generation of defects such as voids can be reduced.

Here, when the content of Al is less than 0.5% by mass, an operation and effects of smoothing the shape of the end face of the wiring do not improve sufficiently, and fine burrs can be generated. On the other hand, when the content of Al exceeds 7.0% by mass, the hot workability during fabrication of the sputtering target is deteriorated and cracks can be occurred.

From these reasons, the content of Al is in the range of 0.5 to 7.0% by mass. More preferably, the content of Al is in the range of 2.0 to 5.0% by mass.

Next, a laminated wiring film 10 of the present embodiment is explained.

As shown in FIG. 1, the laminated wiring film 10 of the present embodiment is provided with a Cu wiring film 11 formed on a substrate 1 and a protective film 12 formed on the Cu wiring film 11.

Here, the substrate 1 is not particularly limited, but a glass and a resin film or the like which have optical transparency have been used in a flat panel display, a touch panel, or the like.

The Cu wiring film 11 is formed by copper or copper alloy, and the specific resistance thereof is preferred to be 4.0 $\mu\Omega$cm or less (at 25° C. of temperature). In the present embodiment, the Cu wiring film 11 is formed by an oxygen-free copper having a purity of 99.99% by mass or more, and the specific resistance thereof is 3.5 $\mu\Omega$cm or less (at 25° C. of temperature). In addition, this Cu wiring film 11 is formed by using a sputtering target containing an oxygen-free copper having a purity of 99.99% by mass or more.

In addition, the thickness A of the Cu wiring film 11 is preferred to be within 50 nm≤A≤800 nm, and more preferably, within 100 nm≤A≤300 nm.

The protective film 12 is formed by using a sputtering target for forming a protective film of the present embodiment, and the sputtering target has the same composition as the sputtering target for forming a protective film described above.

The thickness B of the protective film 12 is preferred to be within 5 nm≤B≤100 nm, and more preferably, within 10 nm≤B≤50 nm.

In addition, the ratio B/A, which is a ratio between the thickness A of the Cu wiring film 11 and the thickness B of the protective film 12, is preferred to be within 0.02<B/A<1.0, more preferably, within 0.1<B/A<0.3.

In the sputtering target for forming a protective film and the laminated wiring film 10 of the present invention with the above configuration, as described above, since the sputtering target has a composition of Ni: 5.0 to 15.0% by mass, Mn: 2.0 to 10.0% by mass, Zn: 30.0 to 50.0% by mass, Al: 0.5 to 7.0% by mass, and the remainder composed of Cu and inevitable impurities and is formed by a Cu-base alloy, even if etching is performed by an etching solution including iron chloride, etching is performed satisfactory, and the generation of the undissolved residue can be suppressed.

In particular, since the sputtering target for forming a protective film and protective film 12 contain Al in the range described above, the fine burrs occurring on an end face of the etched laminated wiring film 10 can be suppressed and generation of voids can be suppressed.

In addition, since the sputtering target for forming a protective film and protective film 12 contain Ni in the range described above, the weather resistance improves and the surface discoloration of the laminated wiring film 10 can be reliably suppressed.

Furthermore, since the sputtering target for forming a protective film and protective film 12 contain Mn in the range described above, the weather resistance improves and the surface discoloration of the laminated wiring film 10 can be reliably suppressed.

Moreover, since the sputtering target for forming a protective film and protective film 12 do not contain Cr, treatment of the waste liquid after etching can be performed in a low cost.

In addition, since the content of Ni is a relatively small amount such as 5 to 15% by mass, the fabrication cost of the sputtering target for forming a protective film and the laminated wiring film 10 can be reduced significantly.

Furthermore, since hot workability, cold workability and machinability are excellent, the sputtering target for forming a protective film of the present invention can good fabricate.

In addition, in the present embodiment, since the Cu wiring film 11 is formed by an oxygen-free copper having 3.5 $\mu\Omega$cm or less of the specific resistance (at 25° C. of temperature) and the thickness A of the Cu wiring film 11 is 50 nm≤A≤800 nm, a good conduction can be obtained by the Cu wiring film 11.

Furthermore, in the present embodiment, since the thickness B of the protective film 12 is 5 nm≤B≤100 nm and the ratio B/A, which is a ratio between the thickness A of the Cu wiring film 11 and the thickness B of the protective film 12, is 0.02<B/A<1.0, the discoloration of the Cu wiring film 11 can be reliably suppressed.

The embodiment of the present invention was explained as described above, however, the present invention is not limited to the configuration of the above described embodiment, but changes can be made without departing from the spirit thereof.

For example, in the present embodiment, the structure forming the laminated wiring film on the substrate is explained as an example. However, it is not limited to the above. A transparent conductive film such as ITO film and AZO film can be formed on the substrate, and the laminated wiring film can be formed thereon.

In addition, the Cu wiring film is explained that it is formed by an oxygen-free copper having a purity of 99.99% by mass or more, however, it is not limited as above, and the Cu wiring film can be formed by a pure copper such as a tough pitch copper, or a copper alloy containing a small amount of additive elements.

Furthermore, the thickness A of the Cu wiring film, the thickness B of the protective film and the thickness ratio B/A are not limited to the present embodiment described herein, and they can be another configuration.

Examples

The results of the evaluation test, which evaluates with respect to the operation and effects of the sputtering target for forming a protective film and the laminated wiring film according to the present invention, are explained below.

<Pure Copper Target for Forming Cu Wiring Film>

An ingot of an oxygen-free copper having a purity of 99.99% by mass were prepared, hot rolling at 800° C., stress relieve annealing and machining were performed to the ingot, and a pure copper target for forming Cu wiring film having a size of 100 mm of outer diameter and 5 mm of thickness was fabricated.

Next, backing plates made of oxygen-free copper were prepared, the pure copper target for forming Cu wiring film described above was placed on the oxygen-free copper backing plate, and then was soldered thereto with an indium solder at a temperature of 200° C. Accordingly a target with a backing plate was fabricated.

<Sputtering Target for Forming a Protective Film>

As melting materials, an oxygen-free copper (having a purity of 99.99% by mass), low-carbon nickel (having a purity of 99.9% by mass), electrolytic manganese metal (having a purity of 99.9% by mass), electrolytic zinc (having a purity of 99.99% by mass), and aluminum (having a purity of 99.99% by mass) were prepared, these melting materials were melt with applying high frequency in a crucible made of high purity graphite, the molten metal was adjusted to the components having the composition shown in Table 1, and then cast into a cooled casting mold, and an ingot having a size of 50×50×30 mm was obtained.

Next, with respect to the ingot, hot rolling at 800° C. was performed to the thickness of 10 mm by a draft approximately 10%. After removing oxides and scratches on the surface thereof by face milling, cold rolling was performed to the thickness of 6 mm by a draft approximately 10%, and stress relieve annealing was performed. The surface of the obtained rolled plate was performed machining, and the sputtering targets for forming a protective film of the examples of the present invention 1 to 31 and comparative examples 1 to 8 having a size of 100 mm of outer diameter and 5 mm of thickness were fabricated.

Furthermore, as a conventional example 1, an ingot having a composition containing of Ni: 64.0% by mass, Ti: 4.0% by mass, and the remainder consisting of Cu and inevitable impurities was prepared, hot rolling, stress relieve annealing and machining were performed similarly to the examples of the present invention 1 to 31 and the comparative examples 1 to 8, and a sputtering target having a size of 100 mm of outer diameter and 5 mm of thickness was prepared.

Next, backing plates made of oxygen-free copper were prepared, the obtained sputtering target for forming a protective film was placed on the oxygen-free copper backing plate, and then was soldered thereto with an indium solder at a temperature of 200° C. Accordingly a target with a backing plate was fabricated.

Here, in the sputtering target for forming a protective film of the examples of the present invention 1 to 31, the comparative examples 1 to 8 and the conventional example 1, the presence of the cracks generated during hot rolling and cold rolling were verified. The results were shown in Table 1.

<Laminated Wiring Film>

The pure copper target for forming Cu wiring film was installed inside the sputtering apparatus so that the distance between the pure copper target and a glass substrate (a glass substrate 1737 manufactured by Corning Incorporated having a size of 20 mm by 20 mm and 0.7 mm of thickness) is 70 mm, and sputtering was performed under the following conditions:

Power source: direct current;
Sputtering power: 150 W;
Attained degree of vacuum: $5 \times 10^{-5}$ Pa;
Atmosphere gas composition: pure Ar;
Sputtering gas pressure: 0.67 Pa; and
Glass substrate heating temperature: no heating.

Accordingly, a Cu wiring film having 150 nm of thickness on the surface of the glass substrate was formed.

Subsequently, in the same sputtering condition, sputtering was performed using the sputtering targets for forming a protective film described in Table 1, a protective film having 30 nm of thickness was formed on the Cu wiring film. Accordingly, the laminated wiring films of the examples of the present invention 101 to 131 and the comparative examples 101 to 104 and 107 shown in Table 2 were formed.

In addition, as a conventional example 101, a laminated wiring film, which is formed a protective film formed on a Cu wiring film using a sputtering target of the conventional example 1 described above, was fabricated.

<Adhesion Properties>

A cross-cut adhesion test which performs that: equally spaced cut lines were made at 1 mm intervals in a grid arrangement in each of the laminated wiring films in accordance with JIS-K5400; then, a scotch tape manufactured by 3M Company was put on the surface of the laminated wiring film and was peeled off; and thereafter, an area ratio (area %) of the laminated wiring film remained to adhere to the glass substrate within a 10 mm-square in a center portion of the glass substrate was measured. When the area of the laminated wiring film remained to adhere to the glass substrate was 99% or more, it was determined that there was no peeling off of the film, and when the area thereof was less than 99%, it was determined that there was a peeling off of the film. Each of the evaluation results was shown in Table 2 as "None" which indicates there was no peeling off of the film and "Present" which indicates there was peeling off of the film.

<Weather Resistance>

A constant temperature and humidity test (60° C. and exposing 250 hours at 90% relative humidity) was performed, and the presence of changes in the surface of the laminated wiring film by visual judgement was checked. When the discoloration was observed, it was determined as "Present", and when the discoloration was not observed, it was determined as "None". The evaluation results were shown in Table 2.

<Etching Residue and Burrs>

Photoresist solution (manufactured by Tokyo Ohka Kogyo Co., Ltd.: OFPR-8600LB) was applied to the laminated wiring film formed on the glass substrate, was exposed, and was developed, and a resist film was formed by 30 μm line-and-space. Then it was dipped in a 4% FeCl₃ solution maintained at 30° C.±1° C. of solution temperature, the laminated wiring film was etched, and the wiring was formed.

An ion etching was performed on the cross-section of the wiring by using Ar ion beam, and the Ar ion beam was applied perpendicular to the sample exposed from the masking shield. The obtained cross-section of the wiring was observed by using the secondary electron microscope, and the presence of the etching residue and the burrs on the end face of the wiring was checked. The results of the cross-sectional observation of the conventional example 101 of the laminated wiring film after etching were shown in FIG. 2, the results of the cross-sectional observation of the comparative example 107 of the laminated wiring film after etching were shown in FIG. 3, and the results of the cross-sectional observation of the example of the present invention 101 of the laminated wiring film after etching were shown in FIG. 4.

Figure 2:
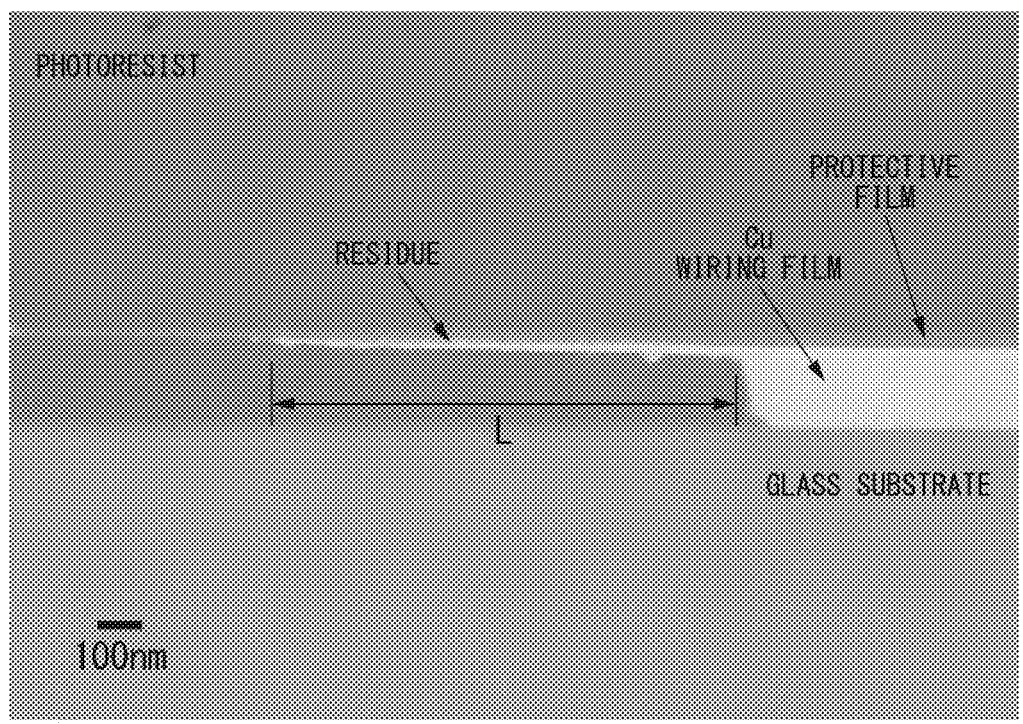
FIG. 2 is a picture showing the result of a cross-sectional observation of a laminated wiring film of the conventional example 101 after etching.
Figure 3:
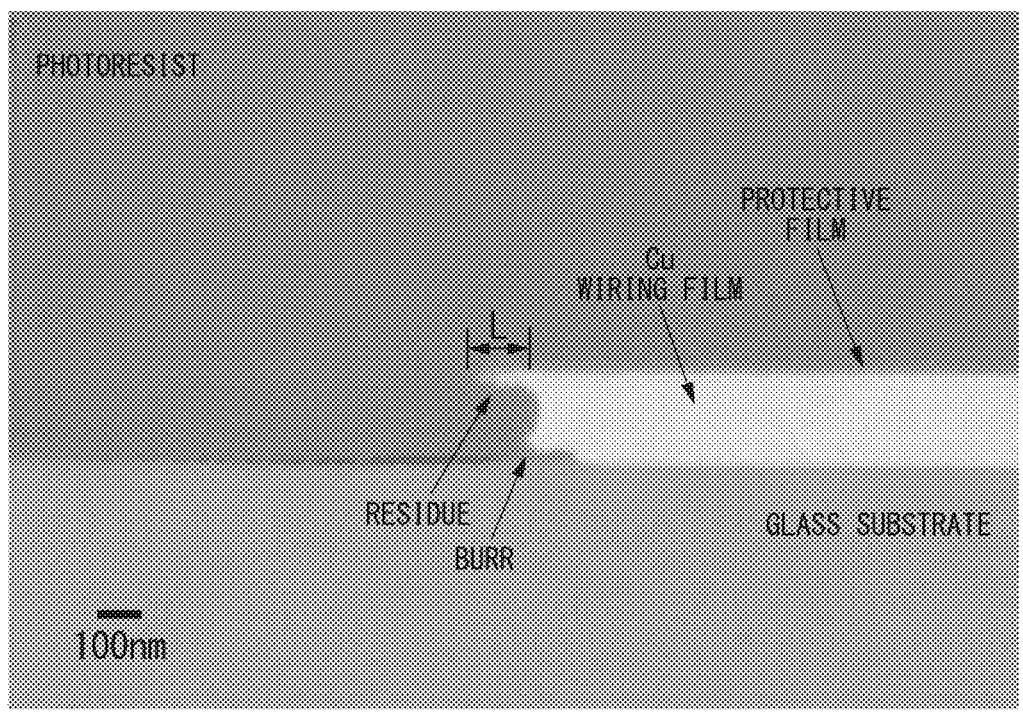
FIG. 3 is a picture showing the result of a cross-sectional observation of a laminated wiring film of the comparative example 107 after etching.

With respect to the etching residue, when the length L of the residue was 300 nm or more as shown in FIG. 2, it was determined as "Present", and when the length L of the residue was less than 300 nm as shown in FIG. 3, it was determined as "None". The evaluation results were shown in Table 2.

Figure 4:
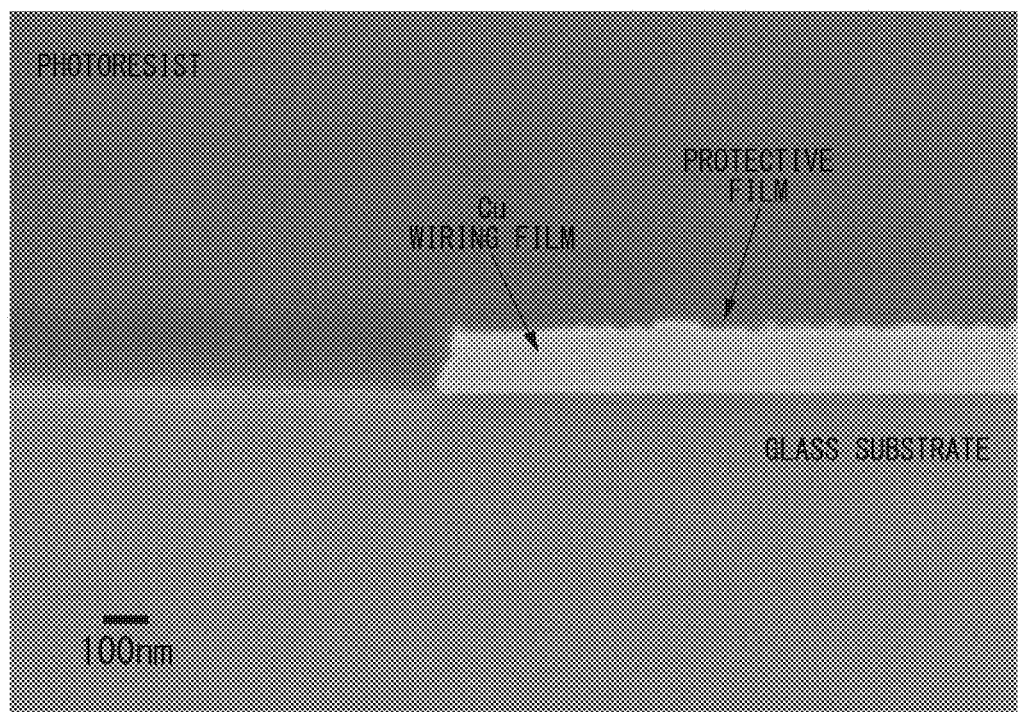
FIG. 4 is a picture showing the result of a cross-sectional observation of a laminated wiring film of the example of the present invention 101 after etching.

With respect to the burrs of the end face of the laminated wiring film, from the observation of the cross-sectional shape of the etched laminated wiring film, when there was a burr as shown in FIG. 3, it was determined as "Present", and when there was no burr as shown in FIG. 4, it was determined as "None". The evaluation results were shown in Table 2.

<Etching Rate>

Sputtering by using the sputtering target for forming a protective film was performed in the same spattering condition as described above, a protective film having 150 nm of thickness was formed on the glass substrate described above. The glass substrate forming a single layer of this protective film was dipped in a 4% FeCl₃ solution maintained at 30° C.±1° C. of solution temperature, the protective film was etched, and the etching rate was obtained by measuring the time of until the disappearance of the protective film by the visual observation. The evaluation results were shown in Table 2.

TABLE 1

|  |  | Component composition (% by mass) |  |  |  |  |  | Cracks during hot rolling | Cracks during cold rolling |
|---|---|---|---|---|---|---|---|---|---|
|  |  | Ni | Mn | Zn | Al | other elements | Cu |  |  |
| Examples of the Present Invention | 1 | 9.0 | 6.1 | 36.1 | 2.2 | — | the remainder | None | None |
|  | 2 | 5.1 | 5.8 | 36.5 | 2.0 | — | the remainder | None | None |
|  | 3 | 14.9 | 6.0 | 36.3 | 2.0 | — | the remainder | None | None |
|  | 4 | 8.9 | 2.2 | 35.8 | 1.9 | — | the remainder | None | None |
|  | 5 | 9.2 | 9.8 | 35.7 | 1.8 | — | the remainder | None | None |
|  | 6 | 9.0 | 5.5 | 30.5 | 2.5 | — | the remainder | None | None |
|  | 7 | 9.3 | 6.0 | 49.0 | 2.4 | — | the remainder | None | None |
|  | 8 | 8.9 | 6.1 | 37.0 | 0.5 | — | the remainder | None | None |
|  | 9 | 8.8 | 6.2 | 36.5 | 6.9 | — | the remainder | None | None |
|  | 10 | 5.2 | 2.1 | 40.0 | 4.5 | — | the remainder | None | None |
|  | 11 | 14.8 | 9.9 | 34.0 | 3.7 | — | the remainder | None | None |
|  | 12 | 5.5 | 4.8 | 30.5 | 4.0 | — | the remainder | None | None |
|  | 13 | 14.0 | 7.7 | 48.0 | 3.2 | — | the remainder | None | None |
|  | 14 | 5.2 | 6.0 | 35.0 | 0.6 | — | the remainder | None | None |
|  | 15 | 14.8 | 6.3 | 49.0 | 7.0 | — | the remainder | None | None |
|  | 16 | 8.8 | 2.2 | 30.1 | 2.2 | — | the remainder | None | None |
|  | 17 | 9.0 | 9.8 | 49.8 | 2.0 | — | the remainder | None | None |
|  | 18 | 12.0 | 2.1 | 38.0 | 0.6 | — | the remainder | None | None |
|  | 19 | 7.0 | 9.9 | 45.5 | 6.9 | — | the remainder | None | None |
|  | 20 | 8.8 | 4.0 | 30.5 | 0.8 | — | the remainder | None | None |
|  | 21 | 11.3 | 7.5 | 48.9 | 6.5 | — | the remainder | None | None |
|  | 22 | 5.5 | 2.3 | 31.0 | 2.2 | — | the remainder | None | None |
|  | 23 | 14.3 | 9.6 | 48.7 | 3.0 | — | the remainder | None | None |
|  | 24 | 6.0 | 2.1 | 40.0 | 0.6 | — | the remainder | None | None |
|  | 25 | 14.1 | 9.0 | 37.1 | 6.1 | — | the remainder | None | None |
|  | 26 | 5.8 | 6.9 | 32.0 | 0.6 | — | the remainder | None | None |
|  | 27 | 13.9 | 7.9 | 43.8 | 6.8 | — | the remainder | None | None |
|  | 28 | 9.0 | 3.0 | 30.5 | 0.7 | — | the remainder | None | None |
|  | 29 | 8.8 | 8.9 | 49.6 | 6.9 | — | the remainder | None | None |
|  | 30 | 5.1 | 2.8 | 30.7 | 0.7 | — | the remainder | None | None |
|  | 31 | 14.8 | 9.8 | 49.8 | 6.7 | — | the remainder | None | None |
| Comparative Examples | 1 | 3.1 | 3.5 | 25.0 | 0.8 | — | the remainder | None | None |
|  | 2 | 20.6 | 6.9 | 40.0 | 4.7 | — | the remainder | None | None |
|  | 3 | 6.9 | 1.0 | 30.0 | 1.2 | — | the remainder | None | None |
|  | 4 | 10.8 | 13.6 | 45.0 | 2.2 | — | the remainder | None | None |
|  | 5 | 8.5 | 6.0 | 25.0 | 2.0 | — | the remainder | Present | — |
|  | 6 | 10.5 | 7.9 | 60.0 | 1.8 | — | the remainder | None | Present |
|  | 7 | 8.0 | 5.9 | 26.0 | 0.0 | — | the remainder | None | None |
|  | 8 | 10.5 | 7.9 | 40.0 | 10.0 | — | the remainder | Present | — |
| Conventional Example | 1 | 64 | — | — | — | Ti: 4.0 | the remainder | None | None |

TABLE 2

|  |  | Sputtering target for forming protective film | Adhesion | Weather Resistance | Etching Residue | Burrs | Etching Rate (nm/sec.) |
|---|---|---|---|---|---|---|---|
| Examples of the present invention | 101 | Example of the Present Invention 1 | None | None | None | None | 8.9 |
| | 102 | Example of the Present Invention 2 | None | None | None | None | 9.9 |
| | 103 | Example of the Present Invention 3 | None | None | None | None | 8.6 |
| | 104 | Example of the Present Invention 4 | None | None | None | None | 9.5 |
| | 105 | Example of the Present Invention 5 | None | None | None | None | 10.3 |
| | 106 | Example of the Present Invention 6 | None | None | None | None | 9.2 |
| | 107 | Example of the Present Invention 7 | None | None | None | None | 9.7 |
| | 108 | Example of the Present Invention 8 | None | None | None | None | 10.6 |
| | 109 | Example of the Present Invention 9 | None | None | None | None | 8.5 |
| | 110 | Example of the Present Invention 10 | None | None | None | None | 9.7 |
| | 111 | Example of the Present Invention 11 | None | None | None | None | 10.4 |
| | 112 | Example of the Present Invention 12 | None | None | None | None | 8.8 |
| | 113 | Example of the Present Invention 13 | None | None | None | None | 10.2 |
| | 114 | Example of the Present Invention 14 | None | None | None | None | 9.1 |
| | 115 | Example of the Present Invention 15 | None | None | None | None | 10.5 |
| | 116 | Example of the Present Invention 16 | None | None | None | None | 8.6 |
| | 117 | Example of the Present Invention 17 | None | None | None | None | 9.7 |
| | 118 | Example of the Present Invention 18 | None | None | None | None | 10.8 |
| | 119 | Example of the Present Invention 19 | None | None | None | None | 8.2 |
| | 120 | Example of the Present Invention 20 | None | None | None | None | 9.1 |
| | 121 | Example of the Present Invention 21 | None | None | None | None | 9.7 |
| | 122 | Example of the Present Invention 22 | None | None | None | None | 10.7 |
| | 123 | Example of the Present Invention 23 | None | None | None | None | 9.0 |
| | 124 | Example of the Present Invention 24 | None | None | None | None | 8.9 |
| | 125 | Example of the Present Invention 25 | None | None | None | None | 10.1 |
| | 126 | Example of the Present Invention 26 | None | None | None | None | 9.5 |
| | 127 | Example of the Present Invention 27 | None | None | None | None | 8.9 |
| | 128 | Example of the Present Invention 28 | None | None | None | None | 9.8 |
| | 129 | Example of the Present Invention 29 | None | None | None | None | 9.2 |
| | 130 | Example of the Present Invention 30 | None | None | None | None | 10.5 |
| | 131 | Example of the Present Invention 31 | None | None | None | None | 8.9 |
| Comparative Examples | 101 | Comparative Example 1 | None | Present | None | None | 8.7 |
| | 102 | Comparative Example 2 | None | None | Present | Present | 7.0 |
| | 103 | Comparative Example 3 | None | Present | None | None | 6.6 |
| | 104 | Comparative Example 4 | None | None | Present | Present | 7.0 |
| | 107 | Comparative Example 7 | None | None | None | Present | 8.5 |
| Conventional Example | 101 | Conventional Example 1 | None | None | Present | Present | 3.6 |

According to the sputtering target for forming a protective film of the comparative example 5, the content of Zn is less than that of the present invention, and cracks were observed during hot rolling. Thus, the fabrication of the sputtering target for forming a protective film was stopped, and the subsequent evaluation was not performed.

According to the sputtering target for forming a protective film of the comparative example 6, the content of Zn is more than that of the present invention, and cracks were observed during cold rolling. Thus, the fabrication of the sputtering target for forming a protective film was stopped, and the subsequent evaluation was not performed.

According to the sputtering target for forming a protective film of the comparative example 8, the content of Al is more than that of the present invention, and cracks were observed during hot rolling. Thus, the fabrication of the sputtering target for forming a protective film was stopped, and the subsequent evaluation was not performed.

In the laminated wiring film of the comparative example 101 formed a protective film by the sputtering target for forming a protective film of the comparative example 1 which has a content of Ni less than that of the example of the present invention, a discoloration was observed in the constant temperature and humidity test, and the weather resistance was not sufficient.

In the laminated wiring film of the comparative example 103 formed a protective film by the sputtering target for forming a protective film of the comparative example 3 which has a content of Mn less than that of the example of the present invention, a discoloration was observed in the constant temperature and humidity test, and therefore, the weather resistance was not sufficient. In addition, the etching rate was slow, and therefore, the etching properties were poor.

In the laminated wiring film of the comparative example 102 formed a protective film by the sputtering target for forming a protective film of the comparative example 2 which has a content of Ni more than that of the example of the present invention, a residue remained after etching, and burrs were generated on the end face of the wiring. In addition, the etching rate was slow, and therefore, the etching properties were poor.

In the laminated wiring film of the comparative example 104 formed a protective film by the sputtering target for forming a protective film of the comparative example 4 which has a content of Mn more than that of the example of the present invention, a residue remained after etching, and burrs were generated on the end face of the wiring. In addition, the etching rate was slow, and therefore, the etching properties were poor.

In the laminated wiring film of the comparative example 107 formed a protective film by the sputtering target for forming a protective film of the comparative example 7 which has a content of Al less than that of the example of the present invention, a residue did not remain after etching as shown in FIG. 3, but fine burrs were generated on the end face of the wiring.

Furthermore, in the laminated wiring film of the conventional example 101 formed a protective film by the sputtering target of the conventional example 1 which contains Ni: 64% by mass, Ti: 4% by mass, and the remainder of Cu and inevitable impurities, a residue remained a lot after etching as shown in FIG. 2. In addition, the etching rate was slow, and therefore, the etching properties were poor.

By contrast, in the sputtering target for forming a protective film of the example of the present invention 1 to 31 in which the content of Zn and Al were within the range of the present invention, cracks were not observed during hot rolling and cold rolling, and a sputtering target for forming a protective film can be fabricated satisfactory.

In addition, in the laminated wiring film of the examples of the present invention 101 to 131 formed a protective film by the sputtering target for forming a protective film of the examples of the present invention 1 to 31 in which the content of Ni and Mn were within the range of the present invention, adhesion properties, the weather resistance and the etching properties were excellent, and the generation of a residue after etching was suppressed sufficiently.

Furthermore, in the laminated wiring film of the examples of the present invention 101 to 131 formed a protective film by the sputtering target for forming a protective film of the examples of the present invention 1 to 31 in which the content of Al was within the range of the present invention, burrs were not observed on the end face of the wiring after etching.

As described above, according to the examples of the present invention, it was confirmed that: the present invention can provide a sputtering target for forming a protective film which can form a protective film having good weather resistance and being able to suppress the surface discoloration, having good etching properties, and being able to suppress the occurrence of burrs and generation of the residue undissolved; and the present invention can provide a laminated wiring film provided with the protective film formed by the sputtering target.

DESCRIPTION OF REFERENCE SIGNS

1: Substrate
10: Laminated wiring film
11: Cu wiring film
12: Protective film

The invention claimed is:

1. A backing plate-attached sputtering target for forming a protective film, which is used to form a protective film on one or both surfaces of a Cu wiring film,
   the backing plate-attached target comprising a backing plate and a sputtering target that is soldered on the backing plate by using indium,
   the sputtering target consisting of:
   Ni: 5.0 to 15.0% by mass,
   Mn: 2.0 to 10.0% by mass,
   Zn: 30.1% to 50.0% by mass,
   Al: 2.0 to 4.5% by mass, and
   the remainder composed of Cu and inevitable impurities,
   wherein the sputtering target is produced by hot rolling and cold rolling an ingot consisting of Ni: 5.0 to 15.0% by mass, Mn: 2.0 to 10.0% by mass, Zn: 30.1% to 50.0% by mass, Al: 2.0 to 4.5% by mass, and the remainder composed of Cu and inevitable impurities.

2. The backing plate-attached sputtering target for forming a protective film according to claim 1, wherein
   the sputtering target consists of Ni: 7.0 to 11.0% by mass, Mn: 4.0 to 8.0% by mass, Zn: 35.0 to 45.0% by mass, Al: 2.0 to 4.5% by mass, and the remainder composed of Cu and inevitable impurities.

* * * * *